(12) United States Patent
He et al.

(10) Patent No.: US 11,670,253 B2
(45) Date of Patent: Jun. 6, 2023

(54) PIXEL DRIVING CIRCUIT, ARRAY SUBSTRATE AND DISPLAY PANEL

(71) Applicant: BOE TECHNOLOGY GROUP CO., LTD., Beijing (CN)

(72) Inventors: Shengyi He, Beijing (CN); Shuai Wang, Beijing (CN); Zheng Zhou, Beijing (CN); Fan Jia, Beijing (CN); Li Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/486,516

(22) Filed: Sep. 27, 2021

(65) Prior Publication Data

US 2022/0254314 A1 Aug. 11, 2022

(30) Foreign Application Priority Data

Feb. 8, 2021 (CN) .......................... 202110170954.7

(51) Int. Cl.
*G09G 3/36* (2006.01)
(52) U.S. Cl.
CPC ... *G09G 3/3648* (2013.01); *G09G 2300/0426* (2013.01); *G09G 2300/0809* (2013.01); *G09G 2330/08* (2013.01)
(58) Field of Classification Search
CPC ......... G09G 3/3648; G09G 2300/0426; G09G 2300/0809; G09G 2330/08; H01L 27/00
See application file for complete search history.

(56) References Cited

U.S. PATENT DOCUMENTS

| | | | | |
|---|---|---|---|---|
| 9,588,387 B2* | 3/2017 | Lv | ...................... | G02F 1/136259 |
| 9,958,992 B2* | 5/2018 | Cho | ...................... | G06F 3/0446 |
| 10,297,197 B2* | 5/2019 | Chung | ................. | G09G 3/3233 |
| 10,395,594 B1* | 8/2019 | Charisoulis | .......... | G09G 3/3275 |
| 10,748,487 B2* | 8/2020 | Miyasaka | ............ | G09G 3/3258 |
| 2004/0100430 A1* | 5/2004 | Fruehauf | .............. | G09G 3/3233 345/82 |
| 2005/0110720 A1* | 5/2005 | Akimoto | .............. | G09G 3/3258 345/76 |
| 2007/0139346 A1* | 6/2007 | Chen | .................... | G09G 3/3659 345/98 |
| 2008/0123002 A1* | 5/2008 | Yeh | ................... | G02F 1/136286 349/33 |
| 2009/0135114 A1* | 5/2009 | White | ................. | G09G 3/3225 345/78 |

(Continued)

FOREIGN PATENT DOCUMENTS

| CN | 102998869 A | 3/2013 |
|---|---|---|
| CN | 105047163 A | 11/2015 |
| CN | 106054416 A | 10/2016 |

*Primary Examiner* — Benyam Ketema
(74) *Attorney, Agent, or Firm* — Houtteman Law LLC

(57) ABSTRACT

The present disclosure provides a pixel driving circuit, an array substrate and a display panel. The pixel driving circuit of the present disclosure includes a switch transistor and N redundant switch transistors, the switch transistor and the N redundant switch transistors are connected in series, a second electrode of an $N^{th}$ redundant switch transistor is coupled to a first electrode of the switch transistor, and a second electrode of the switch transistor is coupled to a display electrode.

17 Claims, 4 Drawing Sheets

(56) References Cited

U.S. PATENT DOCUMENTS

| | | | |
|---|---|---|---|
| 2009/0295422 A1* | 12/2009 | Hamer | G09G 3/3233 |
| | | | 324/760.02 |
| 2011/0122055 A1* | 5/2011 | Lee | G02F 1/136286 |
| | | | 345/92 |
| 2011/0164018 A1* | 7/2011 | Kang | G09G 3/3233 |
| | | | 345/76 |
| 2012/0154262 A1* | 6/2012 | Yamauchi | G09G 3/3659 |
| | | | 345/98 |
| 2013/0002633 A1* | 1/2013 | Chung | G09G 3/3233 |
| | | | 345/76 |
| 2014/0028733 A1* | 1/2014 | Lee | G09G 3/3266 |
| | | | 345/82 |
| 2014/0111506 A1* | 4/2014 | Zhang | G09G 3/20 |
| | | | 345/215 |
| 2018/0197476 A1* | 7/2018 | Xi | G09G 3/3233 |
| 2018/0301106 A1* | 10/2018 | Huang | G09G 3/3677 |
| 2019/0035336 A1* | 1/2019 | Park | G09G 3/3233 |
| 2019/0130848 A1* | 5/2019 | Kim | G09G 3/3266 |
| 2020/0105196 A1* | 4/2020 | Xuan | G09G 3/3233 |
| 2020/0152132 A1* | 5/2020 | Kim | H10K 59/123 |
| 2020/0160789 A1* | 5/2020 | Park | G09G 3/3258 |
| 2020/0210010 A1* | 7/2020 | Kim | G06F 3/0443 |
| 2020/0211433 A1* | 7/2020 | Lin | G09G 3/20 |
| 2020/0381458 A1* | 12/2020 | Yang | H01L 27/124 |
| 2020/0410934 A1* | 12/2020 | Jeon | G09G 3/3266 |
| 2021/0064170 A1* | 3/2021 | Hwang | G06F 3/038 |
| 2021/0328163 A1* | 10/2021 | Huang | H10K 85/221 |
| 2021/0407381 A1* | 12/2021 | Park | G09G 3/3233 |
| 2022/0006052 A1* | 1/2022 | Huang | H10K 71/00 |
| 2022/0085074 A1* | 3/2022 | He | H01L 27/1248 |
| 2022/0165228 A1* | 5/2022 | Liu | G09G 3/3677 |
| 2022/0223084 A1* | 7/2022 | Lai | G09G 3/20 |

* cited by examiner

PIXEL DRIVING CIRCUIT, ARRAY SUBSTRATE AND DISPLAY PANEL

CROSS-REFERENCE TO RELATED APPLICATIONS

The present application claims the priority of Chinese Patent Application NO. 202110170954.7, filed on Feb. 8, 2021, the contents of which are incorporated herein in their entirety by reference.

TECHNICAL FIELD

The present disclosure relates to the field of display technology, and particularly relates to a pixel driving circuit, an array substrate and a display panel.

BACKGROUND

Compared with a material of a channel of a TFT (Thin Film Transistor) device of a display panel in the related art, a semiconductor single-walled carbon nanotube (s-SWCNT) material has characteristics of high mobility, convenient for realization of flexibility, and the like, and is continuously concerned by academia and industry.

SUMMARY

In a first aspect, an embodiment of the present disclosure provides a pixel driving circuit, including a switch transistor and N redundant switch transistors, where N is a positive integer, and N≥1; a control electrode of the switch transistor and a control electrode of each redundant switch transistor are coupled to a gate line;

in response to that N=1, a first electrode of the redundant switch transistor is coupled to a data line, a second electrode of the redundant switch transistor is coupled to a first electrode of the switch transistor, and a second electrode of the switch transistor is coupled to a display electrode;

in response to that N=2, a first electrode of a first redundant switch transistor is coupled to the data line, a first electrode of a second redundant switch transistor is coupled to a second electrode of the first redundant switch transistor, a second electrode of the second redundant switch transistor is coupled to the first electrode of the switch transistor, and the second electrode of the switch transistor is coupled to the display electrode;

in response to that N>2, the first electrode of the first redundant switch transistor is coupled to the data line, a first electrode of an $(M+1)^{th}$ redundant switch transistor is coupled to a second electrode of an $M^{th}$ redundant switch transistor, and a second electrode of the $(M+1)^{th}$ redundant switch transistor is coupled to a first electrode of an $(M+2)^{th}$ redundant switch transistor; a second electrode of an $N^{th}$ redundant switch transistor is coupled to the first electrode of the switch transistor, and the second electrode of the switch transistor is coupled to the display electrode; M is a positive integer, and 1≤M≤N−2.

In some implementations, an active layer of the switch transistor includes a carbon nanotube material.

In some implementations, the carbon nanotube material is a single-walled carbon nanotube material.

In some implementations, materials of active layers of the switch transistor and the redundant switch transistor are the same.

In some implementations, control electrodes of the redundant switch transistor and the switch transistor are disposed in a same layer.

In some implementations, the first electrode and the second electrode of the redundant switch transistor are disposed in a same layer as the first electrode and the second electrode of the switch transistor.

In some implementations, active layers of the redundant switch transistor and the switch transistor are disposed in a same layer.

In some implementations, a width-to-length ratio of a channel region of the redundant switch transistor is less than or equal to a width-to-length ratio of a channel region of the switch transistor.

In some implementations, a width-to-length ratio of a channel region of the redundant switch transistor ranges from 1:1 to 10:1.

In some implementations, the control electrode of the switch transistor, the control electrode of the redundant switch transistor, and the gate line are formed into a single piece.

In a second aspect, an embodiment of the present disclosure provides an array substrate, which includes pixel units arranged in an array, each pixel unit includes a pixel driving circuit and a display electrode, and at least part of the pixel units each include the pixel driving circuit described above.

In some implementations, pixel driving circuits in a same row are coupled to a same gate line, and pixel driving circuits in a same column are coupled to a same data line.

In some implementations, the display electrode is a pixel electrode.

In some implementations, the display electrode is an anode of an organic light emitting diode.

In some implementations, the switch transistor and the redundant switch transistor in the pixel driving circuit in each pixel unit are both located between the gate line and the display electrode.

In a third aspect, an embodiment of the present disclosure provides a display panel, which includes the array substrate and an opposite substrate disposed opposite to the array substrate.

In some implementations, the display panel includes a liquid crystal panel or an organic electroluminescent diode display panel.

In some implementations, the opposite substrate includes a color filter substrate.

DESCRIPTION OF EMBODIMENTS

Figure 1:
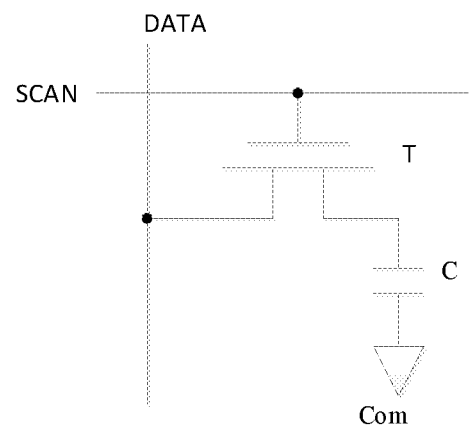
FIG. 1 is a schematic diagram of a pixel driving circuit.

In order that those skilled in the art will better understand the technical solutions of the present disclosure, the following detailed description is given with reference to the accompanying drawings and the specific embodiments.

In the related art, it is difficult to obtain a solution of semiconductor single-walled carbon nanotube (s-SWCNT) material with a purity of 100%, and the resulting solution of semiconductor single-walled carbon nanotube material usually contains a trace amount of metallic single-walled carbon nanotube (m-SWCNT) material. Thus, during forming channels of TFT devices using the semiconductor single-walled carbon nanotube (s-SWCNT) material, the metallic single-walled carbon nanotube (m-SWCNT) material may be present in some of the channels of the TFT devices. When the display panel is in operation, if the channel of the TFT device contains the metallic single-walled carbon nanotube (m-SWCNT) material, a current may be allowed between a source and a drain of the TFT device unconditionally (i.e., a short circuit occurs), which may cause abnormal performance of the TFT device and further cause a display defect of the display panel.

In view of above, the present disclosure provides a pixel driving circuit, an array substrate, and a display panel to solve at least part of technical problems in the related art.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents do not denote a limitation of quantity, but rather denote the presence of at least one. The word "include" or "comprise", and the like, means that the element or item appearing in front of the word, and the equivalent thereof, includes the element or item listed after the word, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may also be changed accordingly.

It should be noted that transistors used in the embodiments of the present disclosure may be thin film transistors or field effect transistors or other devices with the same and similar characteristics, and since the source and the drain of the transistor are symmetrical, the source and the drain are not different. In the embodiments of the present disclosure, to distinguish the source and the drain of the transistor, one of the source and the drain is referred to as a first electrode, the other is referred to as a second electrode, and the gate of the transistor is referred to as a control electrode. In addition, the transistors can be divided into N-type transistors and P-type transistors according to characteristics of the transistors, and in the following embodiments, P-type transistors being used is taken as an example for explanation, when the P-type transistors are used, the first electrode is the source of the P-type transistor, the second electrode is the drain of the P-type transistor, when a low level is input into the gate of the P-type transistor, the source and the drain of the P-type transistor are communicated (i.e., a current is allowed therebetween), the P-type transistor is turned on, and for the N-type transistors, when a high level is input into the gate of the N-type transistor, the source and the drain of the N-type transistor are communicated (i.e., a current is allowed therebetween), and the N-type transistor is turned on. It is contemplated that implementations employing the N-type transistors will be readily contemplated by those of ordinary skill in the art based on the embodiments of the present disclosure without inventive faculty, and thus would fall within the scope of the embodiments of the present disclosure.

Figure 7:
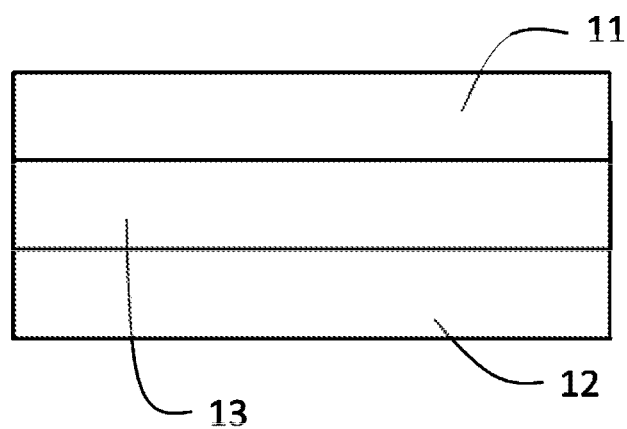
FIG. 7 is a schematic structural diagram of a display panel according to the present disclosure.

As shown in FIG. 7, a thin film transistor-liquid crystal display (TFT-LCD) panel includes an array substrate 11 and an opposite substrate 12 which are aligned and combined into a cell, and a liquid crystal layer 13 interposed therebetween. The opposite substrate 12 may include, but is not limited to, a color filter substrate. The array substrate 11 generally includes a plurality of pixel units arranged in an array, a pixel driving circuit is disposed in each pixel unit, each pixel driving circuit may include a switch transistor, a first electrode of the switch transistor is coupled to a data line, a second electrode of the switch transistor is coupled to a display electrode, and a control electrode of the switch transistor is coupled to a gate line. The display electrode generally refers to a pixel electrode, and it should be understood that the display panel includes not only a pixel electrode but also a common electrode, and if an electric field mode of the display panel is different, arrangement positions of the pixel electrode and the common electrode are also different, for example, in the display panel of a horizontal electric field mode, the pixel electrode and the common electrode are both arranged on the array substrate, and in the display panel of a vertical electric field mode, the pixel electrode is arranged on the array substrate, and the common electrode is arranged on the color filter substrate. In the embodiments of the present disclosure, the vertical electric field mode is taken as an example for explanation.

FIG. 1 is a schematic structural diagram of a pixel driving circuit, as shown in FIG. 1, the pixel driving circuit includes a switch transistor T, a gate of the switch transistor T is coupled to a scan line SCAN, a source of the switch transistor T is coupled to a data line DATA, a drain of the switch transistor T is coupled to a pixel electrode, and the pixel electrode and a common electrode Com form a liquid crystal capacitor C. When a short circuit occurs between the source and the drain of the switch transistor T, the switch transistor T cannot be turned on or off according to a signal sent by the scan line SCAN, that is, the switch transistor T is normally turned on, and thus the pixel driving circuit is abnormal, and the display panel is poor in display.

Embodiments of the present disclosure provide a pixel driving circuit, an array substrate and a display panel to at least partially solve the above technical problems. The pixel driving circuit, the array substrate and the display panel provided by the embodiments of the present disclosure are described in further detail below with reference to the accompanying drawings and the detailed description.

In a first aspect, an embodiment of the present disclosure provides a pixel driving circuit, including a switch transistor and N redundant switch transistors, where N is a positive integer, and N≥1; a gate of the switch transistor and a gate of each redundant switch transistor are coupled to a gate line;

in response to that N=1, a source of the redundant switch transistor is coupled to the data line, a drain of the redundant switch transistor is coupled to a source of the switch transistor, and a drain of the switch transistor is coupled to a pixel electrode;

in response to that N=2, a source of a first redundant switch transistor is coupled to the data line, a source of a second redundant switch transistor is coupled to a drain of the first redundant switch transistor, a drain of the second redundant switch transistor is coupled to the source of the switch transistor, and the drain of the switch transistor is coupled to the pixel electrode;

in response to that N>2, the source of the first redundant switch transistor is coupled to the data line, a source of an $(M+1)^{th}$ redundant switch transistor is coupled to a drain of an $M^{th}$ redundant switch transistor, and a drain of the $(M+1)^{th}$ redundant switch transistor is coupled to a source of an $(M+2)^{th}$ redundant switch transistor; a drain of an $N^{th}$ redundant switch transistor is coupled to the source of the switch transistor, and the drain of the switch transistor is coupled to the pixel electrode; M is a positive integer, and $1 \leq M \leq N-2$. Illustratively, for example, the pixel driving circuit includes three redundant switch transistors, i.e., N=3, the source of the first redundant switch transistor is coupled to the data line, the drain of the first redundant switch transistor is coupled to the source of the second redundant switch transistor, the drain of the second redundant switch transistor is coupled to the source of the third redundant switch transistor, the drain of the third redundant switch transistor is coupled to the source of the switch transistor, and the drain of the switch transistor is coupled to the pixel electrode.

In the embodiment of the present disclosure, since the pixel driving circuit is provided with the N redundant switch transistors, and the redundant switch transistors and the switch transistor form a series structure, when the source and the drain of the switch transistor are short-circuited, the short-circuited switch transistor is equivalent to a load connected in series in the circuit, and the redundant switch transistor that operates normally can still realize a switching function, so that a phenomenon of poor display cannot be caused. Alternatively, when the source and the drain of a certain redundant switch transistor are short-circuited, any other redundant switch transistor and the switch transistor which operate normally can realize the switching function, and thus the redundant switch transistors being arranged in the pixel driving circuit can improve an overall yield of the display panel, and reduce a maintenance cost.

Figure 2:
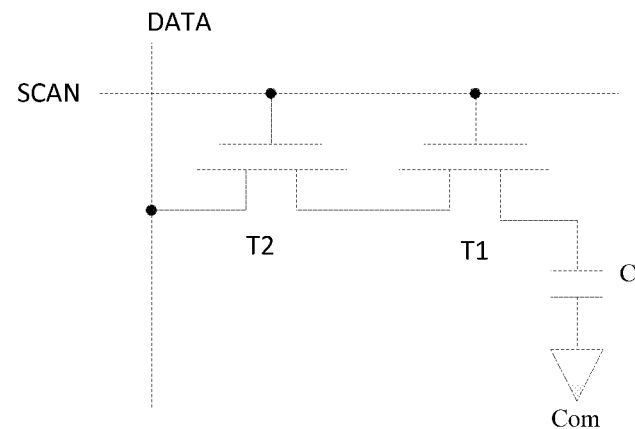
FIG. 2 is a schematic structural diagram of a pixel driving circuit according to an embodiment of the present disclosure.

The pixel driving circuit provided by the present disclosure is described below as including only one redundant switch transistor as an example. FIG. 2 is a schematic structural diagram of a pixel driving circuit according to an embodiment of the present disclosure, and as shown in FIG. 2, the pixel driving circuit includes a switch transistor T1 and a redundant switch transistor T2, a gate of the switch transistor T1 and a gate of the redundant switch transistor T2 are coupled to a gate line SCAN, a source of the redundant switch transistor T2 is coupled to a data line DATA, a drain of the redundant switch transistor T2 is coupled to a source of the switch transistor T1, and a drain of the switch transistor T1 is coupled to a pixel electrode.

In the embodiment, the redundant switch transistor T2 is provided in the pixel drive circuit, and the redundant switch transistor T2 is connected in series with the switch transistor T1. Therefore, when the source and the drain of the switch transistor T1 are short-circuited, the short-circuited switch transistor T1 is equivalent to a load connected in series in the circuit, and the redundant switch transistor T2 that operates normally can still perform a switching function, so that a display failure phenomenon is not caused. Alternatively, when the source and the drain of the redundant switch transistor T2 are short-circuited, the switch transistor T1 that operates normally can still perform the switching function. Therefore, the redundant switch transistor being arranged in the pixel driving circuit can improve the overall yield of the display panel, and reduce the maintenance cost.

Figure 3:
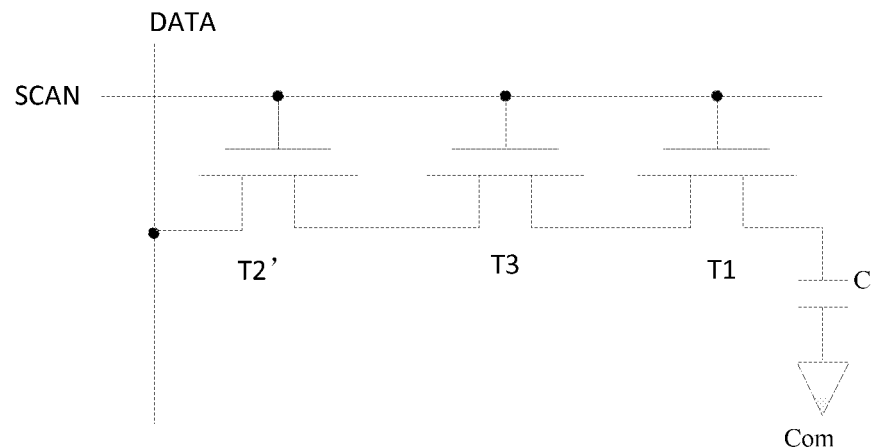
FIG. 3 is another schematic structural diagram of a pixel driving circuit according to an embodiment of the present disclosure.

FIG. 3 is another schematic structural diagram of a pixel driving circuit according to an embodiment of the present disclosure, and as shown in FIG. 3, the pixel driving circuit includes a first redundant switch transistor T2', a second redundant switch transistor T3, and a switch transistor T1. A source of the first redundant switch transistor T2' is coupled to the data line, a drain of the first redundant switch transistor T2' is coupled to a source of the second redundant switch transistor T3, a drain of the second redundant switch transistor T3 is coupled to a source of the switch transistor T1, and a drain of the switch transistor T1 is coupled to a pixel electrode.

In the embodiment, the pixel driving circuit is provided with the first redundant switch transistor T2' and the second redundant switch transistor T3, and the first redundant switch transistor T2' and the second redundant switch transistor T3 are connected in series with the switch transistor T1. Therefore, when the source and the drain of the switch transistor T1 are short-circuited, the short-circuited switch transistor T1 is equivalent to a load connected in series in the circuit, and the first redundant switch transistor T2' and the second redundant switch transistor T3 which operate normally can still perform a switching function, so that a display failure phenomenon is not caused. Alternatively, when the source and the drain of the first redundant switch transistor T2' are short-circuited, the second redundant switch transistor T3 and the switch transistor T1 which operate normally can still perform the switching function. Alternatively, when the source and the drain of the second redundant switch transistor T3 are short-circuited, the first redundant switch transistor T2' and the switch transistor T1 which operate normally can still perform the switching function. Therefore, the redundant switch transistors being arranged in the pixel driving circuit can improve an overall yield of the display panel, and reduce the maintenance cost.

Figure 4:
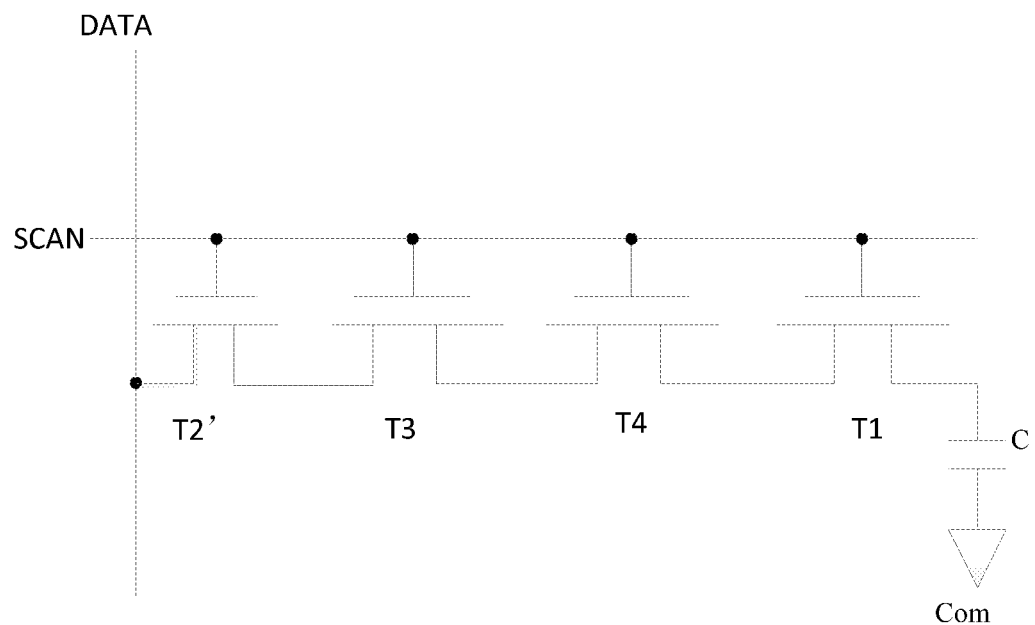
FIG. 4 is another schematic structural diagram of a pixel driving circuit according to an embodiment of the present disclosure.

FIG. 4 is another schematic structural diagram of a pixel driving circuit according to an embodiment of the present disclosure, and as shown in FIG. 4, the pixel driving circuit includes a first redundant switch transistor T2', a second redundant switch transistor T3, a third redundant switch transistor T4, and a switch transistor T1. A source of the first redundant switch transistor T2' is coupled to the data line, a drain of the first redundant switch transistor T2' is coupled to a source of the second redundant switch transistor T3, a drain of the second redundant switch transistor T3 is coupled to a source of the third redundant switch transistor T4, a drain of the third redundant switch transistor T4 is coupled to a source of the switch transistor T1, and a drain of the switch transistor T1 is coupled to a pixel electrode.

In the embodiment, the pixel driving circuit is provided with the first redundant switch transistor T2', the second redundant switch transistor T3, and the third redundant switch transistor T4, and the first redundant switch transistor T2', the second redundant switch transistor T3, and the third redundant switch transistor T4 are connected in series with the switch transistor T1. Therefore, when the source and the drain of the switch transistor T1 are short-circuited, the short-circuited switch transistor T1 is equivalent to a load connected in series in the circuit, and the first redundant switch transistor T2', the second redundant switch transistor T3, and the third redundant switch transistor T4 that operate normally can still perform a switching function, so that a display failure phenomenon is not caused. Alternatively, when the source and the drain of the first redundant switch transistor T2' are short-circuited, the second redundant switch transistor T3, the third redundant switch transistor T4, and the switch transistor T1, which operate normally, can still perform the switching function. Alternatively, when the source and the drain of the second redundant switch transistor T3 are short-circuited, the first redundant switch transistor T2', the third redundant switch transistor T4, and the switch transistor T1 which operate normally can still perform the switching function. Alternatively, when the source and the drain of the third redundant switch transistor T4 are short-circuited, the first redundant switch transistor T2', the second redundant switch transistor T3, and the switch transistor T1, which operate normally, still can perform the switching function. Therefore, the redundant switch transistors being arranged in the pixel driving circuit can improve the overall yield of the display panel, and reduce the maintenance cost.

It should be noted that, in the embodiment of the present disclosure, in addition to the structures shown in FIG. 2 to FIG. 4, in the case of ensuring a sufficiently large pixel aperture ratio, a greater number of redundant switch transistors may be disposed in the pixel driving circuit, which is not limited in the present disclosure.

Figure 5:
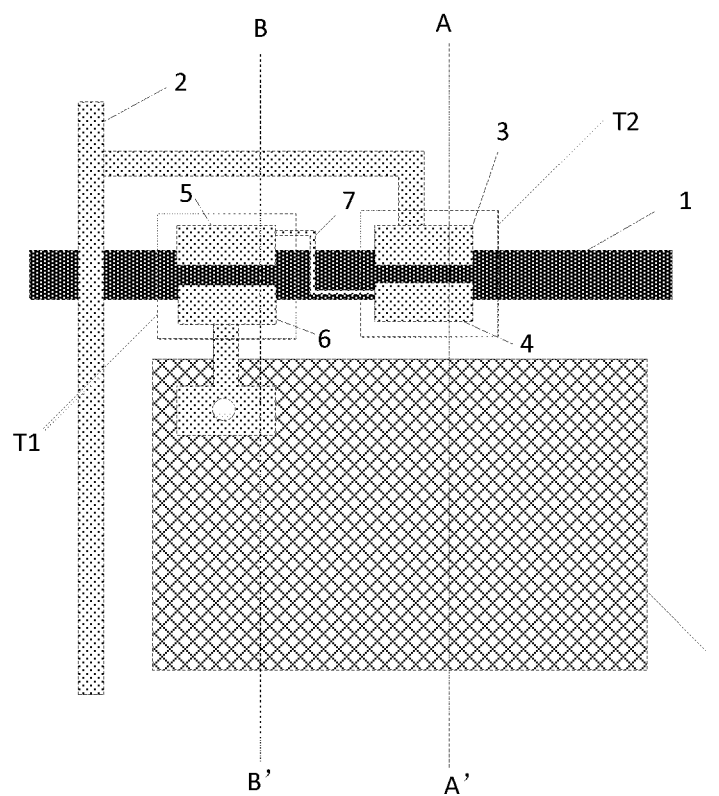
FIG. 5 is a top view of a pixel driving circuit structure.
Figure 6A:
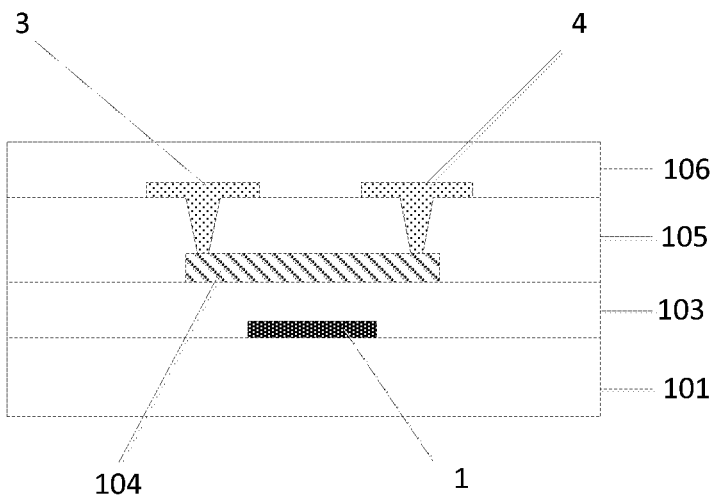
FIG. 6a is a schematic cross-sectional view of the pixel driving circuit structure shown in FIG. 5 taken along line A-A'.
Figure 6B:
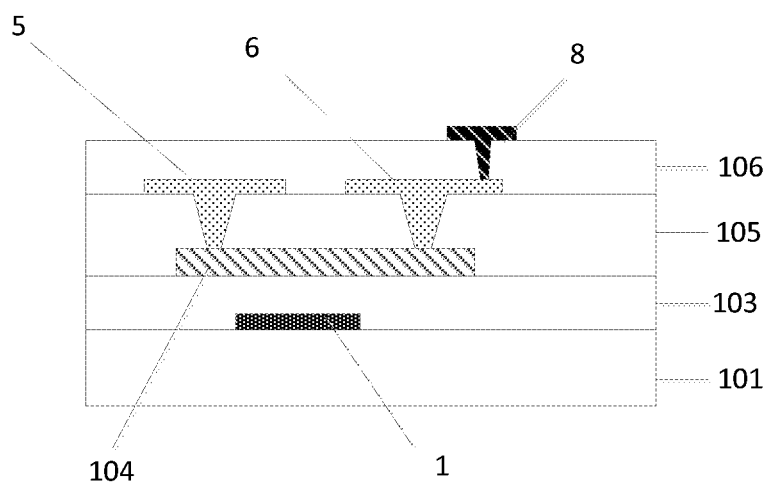
FIG. 6b is a schematic cross-sectional view of the pixel driving circuit structure shown in FIG. 5, taken along line B-B'.

With continuing reference to FIGS. 5, 6a and 6b, FIG. 5 is a top view of a pixel driving circuit structure, FIG. 6a is a schematic cross-sectional view of the pixel driving circuit structure shown in FIG. 5 taken along line A-A', and FIG. 6b is a schematic cross-sectional view of the pixel driving circuit structure shown in FIG. 5 taken along line B-B'. As shown in FIG. 5, the pixel driving circuit includes a switch transistor T1 and a redundant switch transistor T2, a gate of the switch transistor T1 and a gate of the redundant switch transistor T2 are both coupled to a gate line 1, a source 3 of the redundant switch transistor T2 is coupled to a data line 2, a drain 4 of the redundant switch transistor T2 is coupled to a source 5 of the switch transistor T1 through a connection electrode 7, and a drain 6 of the switch transistor T1 is coupled to a pixel electrode 8 through a via hole. The gate of the switch transistor T1, the gate of the redundant switch transistor T2, and the gate line 1 in the embodiment may be formed into a single piece.

In the embodiment of the present disclosure, gates of the redundant switch transistor and the switch transistor may be disposed in a same layer, the source and the drain of the redundant switch transistor and the source and the drain of the switch transistor may be disposed in a same layer, and active layers of the redundant switch transistor and the switch transistor may be disposed in a same layer. Specifically, as shown in FIG. 6a, the gate 1 of the redundant switch transistor T2 is disposed on a substrate 101, a gate insulating layer 103 is disposed on a side of the gate 1 away from the substrate 101, the active layer 104 of the redundant switch transistor T2 is disposed on a side of the gate insulating layer 103 away from the substrate 101, an interlayer insulating layer 105 is disposed on a side of the active layer 104 away from the substrate 101, the source 3 and the drain 4 of the redundant switch transistor T2 are disposed on a side of the interlayer insulating layer 105 away from the substrate 101, and a passivation layer 106 is disposed on a side of the source 3 and the drain 4 away from the substrate 101. As shown in FIG. 6b, the gate 1 of the switch transistor T1 is disposed on the substrate 101, the gate insulating layer 103 is disposed on a side of the gate 1 away from the substrate 101, the active layer 104 of the switch transistor T1 is disposed on a side of the gate insulating layer 103 away from the substrate 101, the interlayer insulating layer 105 is disposed on a side of the active layer 104 away from the substrate 101, the source 5 and the drain 6 of the switch transistor T1 are disposed on a side of the interlayer insulating layer 105 away from the substrate 101, the passivation layer 106 is disposed on a side of the source 5 and the drain 6 away from the substrate 101, the pixel electrode 8 is disposed on a side of the passivation layer 106 away from the substrate 101, and the pixel electrode 8 is electrically coupled to the drain 6 of the switch transistor T1 through a via hole in the passivation layer 106.

In the embodiment of the present disclosure, both the switch transistor and the redundant switch transistor being P-type transistors is taken as an example for explanation. In the embodiment of the present disclosure, when the switch transistor normally operates, a control signal transmitted from the gate line 1 simultaneously controls the switch transistor T1 and the redundant switch transistor T2 to be turned on or off. When the gate line 1 supplies a low level control signal, the switch transistor T1 and the redundant switch transistor T2 are simultaneously turned on, and a data signal written by the data line 2 is transmitted to the pixel electrode through the switch transistor T1 and the redundant switch transistor T2. When the switch transistor T1 is abnormally short-circuited, the redundant switch transistor T2 still can perform a switching function, so that the pixel driving circuit can still operate smoothly. In the embodiment of the disclosure, since the pixel driving circuit is provided with the redundant switch transistor, when the switch transistor is short-circuited, a function of the circuit can be stabilized without being repaired, thereby improving the overall yield of the display panel. Furthermore, at least part of film layers of the redundant switch transistor T2 and the switch transistor T1 are arranged in a same layer, so that preparation steps are reduced, and the cost is saved.

In some implementations, a material of the active layer of the switch transistor may be amorphous silicon, polysilicon, a semiconductor oxide, or the like, and a material of the active layer of the redundant switch transistor may be the same as or different from the material of the active layer of the switch transistor. In some implementations, materials of active layers of the switch transistor and the redundant switch transistor in the embodiment of the present disclosure are the same, for example, the materials of the active layers of the switch transistor and the redundant switch transistor each are single-walled carbon nanotube material. In the embodiment of the present disclosure, since the single-walled carbon nanotube material has a higher mobility than materials of amorphous silicon, polysilicon, semiconductor oxide, and the like, for obtaining a same driving capability, the transistor containing the single-walled carbon nanotube material has a smaller size and a smaller parasitic capacitance, and thus both the switch transistor and the redundant switch transistor in the pixel driving circuit including the single-walled carbon nanotube material can reduce an occupied area of the driving circuit, and improve an aperture ratio of a pixel.

In some implementations, a width-to-length ratio of a channel region of the redundant switch transistor is less than or equal to a width-to-length ratio of a channel region of the switch transistor. It should be noted that parts of the active layers of the redundant switch transistor and the switch transistor that are covered by the gates thereof form channel regions, and parts that are on both sides of the channel regions and not covered by the gates form source contact regions and drain contact regions. In the embodiment of the present disclosure, since the width-to-length ratio of the channel region of the redundant switch transistor is designed to be not greater than the width-to-length ratio of the channel region of the switch transistor, it is possible to ensure a larger aperture ratio of the pixel.

In some implementations, the width-to-length ratio of the channel region of the redundant switch transistor ranges from 1:1 to 10:1. Specifically, a length of the channel region of the redundant switch transistor ranges from 1 μm to 30 μm. In some implementations, the length of the channel region of the redundant switch transistor ranges from 3 μm to 10 μm. In some implementations, a width of the channel region of the redundant switch transistor ranges from 0.5 μm to 5 μm. In some implementations, the width of the channel region of the redundant switch transistor ranges from 1 μm to 3 μm.

In a second aspect, an embodiment of the present disclosure provides an array substrate, which includes the pixel driving circuit described above.

In some implementations, in the array substrate, pixel driving circuits in a same row are coupled to a same gate line, and pixel driving circuits in a same column are coupled to a same data line, so that the wiring is reduced, and the cost is saved.

Specifically, gates of switch transistors and redundant switch transistors in a same row are coupled to a same gate line, and sources of redundant switch transistors in a same column are coupled to a same data line.

In some implementations, the array substrate includes pixel units, each of which includes the pixel driving circuit and a display electrode; the switch transistor and the redundant switch transistor in the pixel driving circuit in each pixel unit are both located between the gate line and the display electrode.

In a third aspect, an embodiment of the present disclosure provides a display panel, which includes the array substrate described above.

In some implementations, the display panel includes a liquid crystal panel, an organic electroluminescent diode display panel, and the like.

In the embodiment, when the display panel is an organic electroluminescent diode display panel, the drain of the switch transistor is coupled to an anode of an organic electroluminescent diode.

Further, the display panel in the embodiment may be any product or component having a display function, such as electronic paper, a mobile phone, a liquid crystal panel, a tablet computer, a television, a display, a notebook computer, a digital photo frame, and a navigator.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are considered to fall within the scope of the present disclosure.

What is claimed is:

1. A pixel driving circuit, comprising a switch transistor and N redundant switch transistors, wherein N is a positive integer and N≽1; a control electrode of the switch transistor and a control electrode of each redundant switch transistor are coupled to a gate line;
   in response to that N=1, a first electrode of the redundant switch transistor is coupled to a data line, a second electrode of the redundant switch transistor is coupled to a first electrode of the switch transistor, and a second electrode of the switch transistor is coupled to a display electrode;
   in response to that N=2, a first electrode of a first redundant switch transistor is coupled to the data line, a first electrode of the second redundant switch transistor is coupled to a second electrode of the first redundant switch transistor, a second electrode of the second redundant switch transistor is coupled to the first electrode of the switch transistor, and the second electrode of the switch transistor is coupled to the display electrode;
   in response to that N>2, the first electrode of the first redundant switch transistor is coupled to the data line, a first electrode of an $(M+1)^{th}$ redundant switch transistor is coupled to a second electrode of an $M^{th}$ redundant switch transistor, and a second electrode of the $(M+1)^{th}$ redundant switch transistor is coupled to a first electrode of an $(M+2)^{th}$ redundant switch transistor; a second electrode of an $N^{th}$ redundant switch transistors is coupled to the first electrode of the switch transistor, and the second electrode of the switch transistor is coupled to the display electrode; M is a positive integer, and 1≼M≼N−2,
   wherein a width-to-length ratio of a channel region of the redundant switch transistor is less than or equal to a width-to-length ratio of a channel region of the switch transistor.

2. The pixel driving circuit according to claim 1, wherein an active layer of the switch transistor comprises a carbon nanotube material.

3. The pixel driving circuit according to claim 2, wherein the carbon nanotube material is a single-walled carbon nanotube material.

4. The pixel driving circuit according to claim 1, wherein active layers of the switch transistor and the redundant switch transistor are made of a same material.

5. The pixel driving circuit according to claim 1, wherein the control electrode of the redundant switch transistor and the control electrode of the switch transistor are provided in a same layer.

6. The pixel driving circuit according to claim 1, wherein the first electrode and the second electrode of the redundant switch transistor are provided in a same layer as the first electrode and the second electrode of the switch transistor.

7. The pixel driving circuit according to claim 1, wherein the active layer of the redundant switch transistor and the active layer of the switch transistor are disposed in a same layer.

8. The pixel driving circuit according to claim 1, wherein a width-to-length ratio of a channel region of the redundant switch transistor ranges from 1:1 to 10:1.

9. The pixel driving circuit according to claim 1, wherein the control electrode of the switch transistor, the control electrode of the redundant switch transistor, and the gate line are formed into a single piece.

10. An array substrate, comprising pixel units arranged in an array, each pixel unit comprising a pixel driving circuit and a display electrode, at least a part of the pixel units each comprising the pixel driving circuit according to claim 1.

11. The array substrate according to claim 10, wherein pixel driving circuits in a same row are coupled to a same gate line, and pixel driving circuits in a same column are coupled to a same data line.

12. The array substrate according to claim 10, wherein the display electrode is a pixel electrode.

13. The array substrate according to claim 10, wherein the display electrode is an anode of an organic light emitting diode.

14. The array substrate according to claim 10, wherein the switch transistor and the redundant switch transistor in the pixel driving circuit in each pixel unit are located between the gate line and the display electrode.

15. A display panel, comprising the array substrate according to claim 10 and an opposite substrate provided opposite to the array substrate.

16. The display panel according to claim 15, wherein the display panel comprises a liquid crystal panel or an organic electroluminescent diode display panel.

17. The display substrate according to claim 15, wherein the opposite substrate comprises a color filter substrate.

* * * * *